United States Patent
Kato et al.

(10) Patent No.: US 12,018,378 B2
(45) Date of Patent: *Jun. 25, 2024

(54) ELECTROLESS PLATING PROCESS

(71) Applicant: KOJIMA CHEMICALS, CO., LTD., Saitama (JP)

(72) Inventors: Tomohito Kato, Saitama (JP); Hideto Watanabe, Saitama (JP)

(73) Assignee: KOJIMA CHEMICALS, CO., LTD., Saitama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/485,543

(22) PCT Filed: Jun. 21, 2018

(86) PCT No.: PCT/JP2018/023630
§ 371 (c)(1),
(2) Date: Aug. 13, 2019

(87) PCT Pub. No.: WO2019/004056
PCT Pub. Date: Jan. 3, 2019

(65) Prior Publication Data
US 2020/0048773 A1    Feb. 13, 2020

(30) Foreign Application Priority Data
Jun. 28, 2017 (JP) ................. 2017-126052

(51) Int. Cl.
*C23C 18/34* (2006.01)
*C23C 18/16* (2006.01)
(Continued)

(52) U.S. Cl.
CPC ......... *C23C 18/44* (2013.01); *C23C 18/1651* (2013.01); *C23C 18/34* (2013.01); *H01L 21/7685* (2013.01); *H01L 21/76874* (2013.01)

(58) Field of Classification Search
CPC ......... C23C 18/52; C23C 18/18; C23C 18/44; C23C 18/34; C23C 18/1651;
(Continued)

(56) References Cited

U.S. PATENT DOCUMENTS 4,181,760 A * 1/1980 Feldstein ............ C23C 18/1841
106/1.11
4,407,869 A * 10/1983 Mallory .................. C23C 18/34
106/1.22
(Continued)

FOREIGN PATENT DOCUMENTS

CN     105386016 A     3/2016
CN     105745355 A     7/2016
(Continued)

OTHER PUBLICATIONS

Office Action issued in Taiwanese Patent Appl. No. 107122017, dated Feb. 22, 2019, along with an English translation thereof.
(Continued)

*Primary Examiner* — Katherine A Bareford
(74) *Attorney, Agent, or Firm* — GREENBLUM & BERNSTEIN, P.L.C.

(57) ABSTRACT

An object is to provide an electroless plating process which can thin a film thickness of a nickel film and can obtain a film having excellent mounting characteristics, when the nickel film and a gold film are sequentially formed on a surface of a copper material. In order to solve the above-mentioned problems, provided is an electroless plating process which sequentially forms a nickel film and a gold film on a surface of a copper material by an electroless plating method and includes: a step of forming the nickel film on the surface of the copper material by an electroless strike plating method; and a step of forming the gold film by a reduction-type electroless plating method.

2 Claims, 8 Drawing Sheets

(51) Int. Cl.
  *C23C 18/44* (2006.01)
  *H01L 21/768* (2006.01)

(58) Field of Classification Search
  CPC ............ C23C 18/1694; C23C 18/1844; H01L 21/7685; H01L 21/288; H01L 21/28; H01L 21/3205; H01L 21/768; H01L 21/76874; H01L 23/532; H01L 23/522; H01L 21/48; H01L 24/16; H01L 24/48; H01L 24/00; H01L 24/85; H01L 24/45; H01L 24/81; H01L 2224/85444; H01L 2224/45015; H01L 2224/48227; H01L 2224/45144; H01L 2224/13101; H01L 2224/81444; H01L 2924/014; H01L 2924/00014; H01L 2924/20752; H01L 2224/02; H01L 2924/03; H01L 2224/16225; H05K 3/18; H05K 3/244; H05K 2203/072; H05K 2203/073; H05K 2203/0789; H05K 2201/0338
  See application file for complete search history.

(56) References Cited

U.S. PATENT DOCUMENTS

| | | | | |
|---|---|---|---|---|
| 4,503,131 | A * | 3/1985 | Baudrand | H01B 1/026 200/266 |
| 5,235,139 | A * | 8/1993 | Bengston | H05K 3/244 174/257 |
| 7,087,104 | B2 * | 8/2006 | Choi | C23C 18/1632 106/1.22 |
| 2011/0051387 | A1 * | 3/2011 | Tachibana | C23C 18/1607 361/783 |
| 2016/0230287 | A1 | 8/2016 | Kato et al. | |
| 2020/0123660 | A1 * | 4/2020 | Kato | H01L 21/288 |

FOREIGN PATENT DOCUMENTS

| | | |
|---|---|---|
| CN | 106011802 A | 10/2016 |
| JP | 5-98454 | 4/1993 |
| JP | 2000-239852 * | 11/2000 |
| JP | 2008-174774 | 7/2008 |
| JP | 2015-110821 A | 6/2015 |
| JP | 2016-160504 | 9/2016 |
| TW | 201522707 A | 6/2015 |
| TW | 201623687 | 7/2016 |

OTHER PUBLICATIONS

International Search Report issued in International Patent Application No. PCT/JP2018/023630, dated Aug. 28, 2018.

Decision to Grant a Patent (Office Action) in Japanese family member Patent Appl. No. 2017-126052, dated Dec. 19, 2018, along with an English translation thereof.

U.S. Appl. No. 16/485,990 to Tomohito Kato et al., which was filed on Aug. 14, 2019.

KR Office Action issued in KR Patent Appl. No. 10-2019-7024866, Oct. 4, 2019, English translation.

1$^{st}$ Office Action issued in CN Patent Appl. No. 201880012615.2, Dec. 4, 2019 per Global Dossier, English translation.

2$^{nd}$ Office Action issued in CN Patent Appl. No. 201880012615.2, Apr. 10, 2020 per Global Dossier, English translation.

3$^{rd}$ Office Action issued in CN Patent Appl. No. 201880012615.2, Jul. 8, 2020 per Global Dossier, English translation.

4$^{th}$ Office Action issued in CN Patent Appl. No. 201880012615.2, Oct. 27, 2020 per Global Dossier, English translation.

* cited by examiner

[Figure 1]
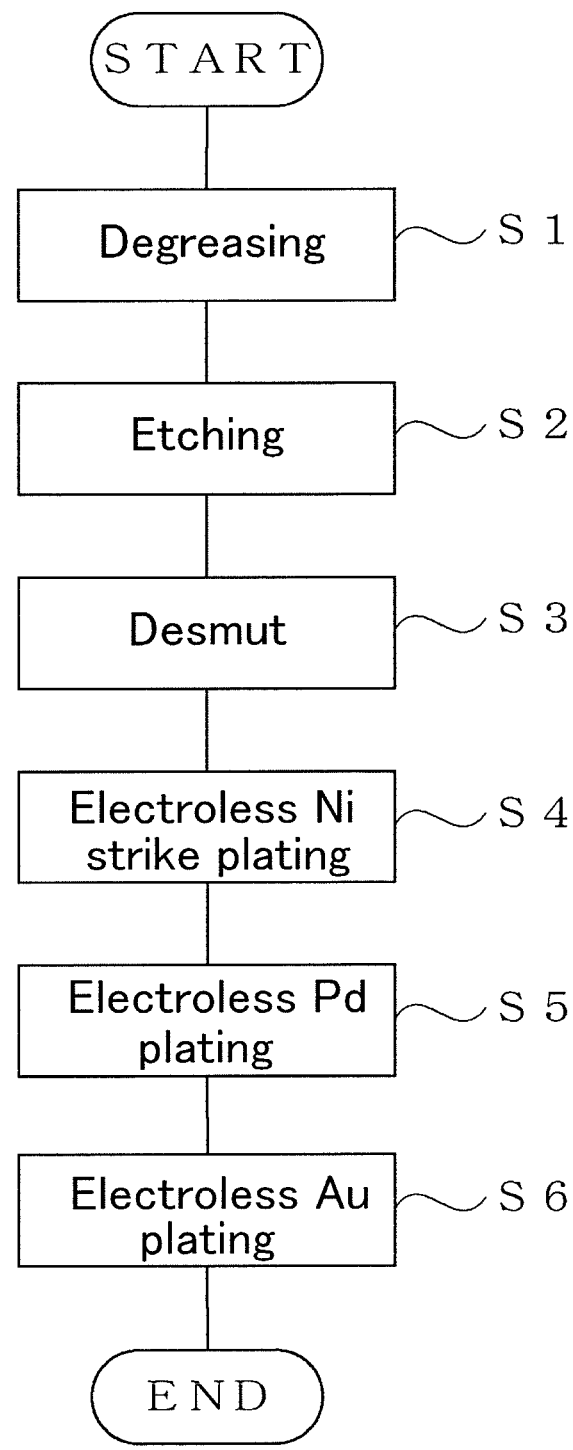

[Figure 2]
(a)
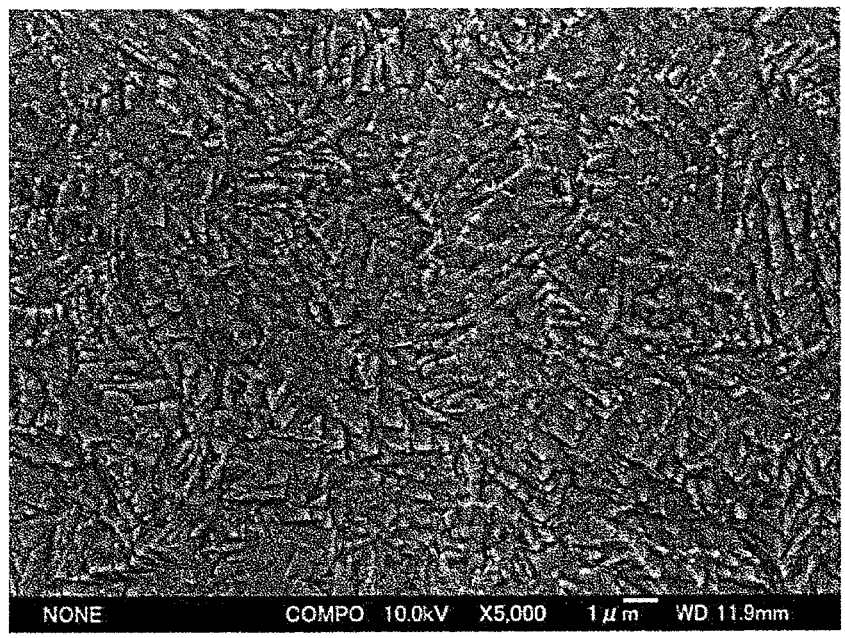
(b)
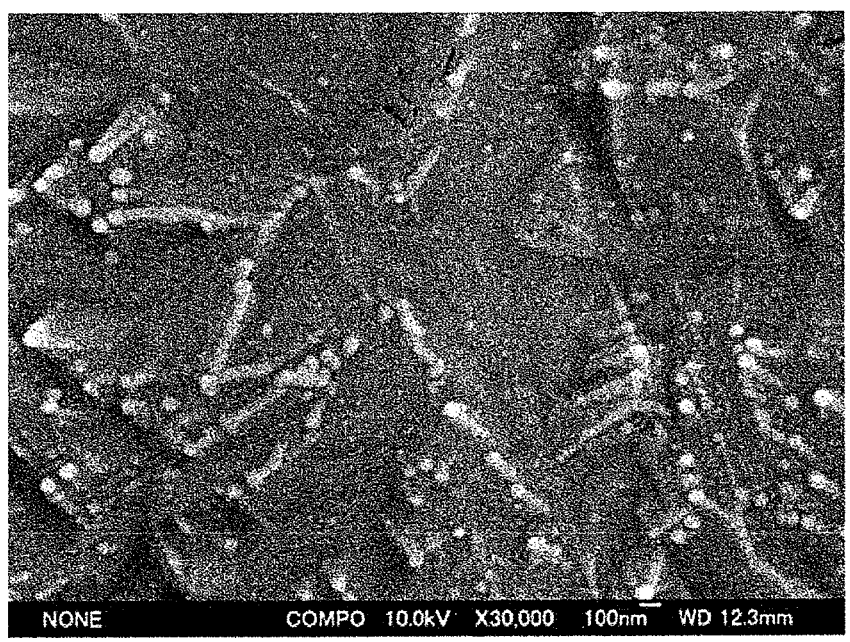

[Figure 3]
(a)
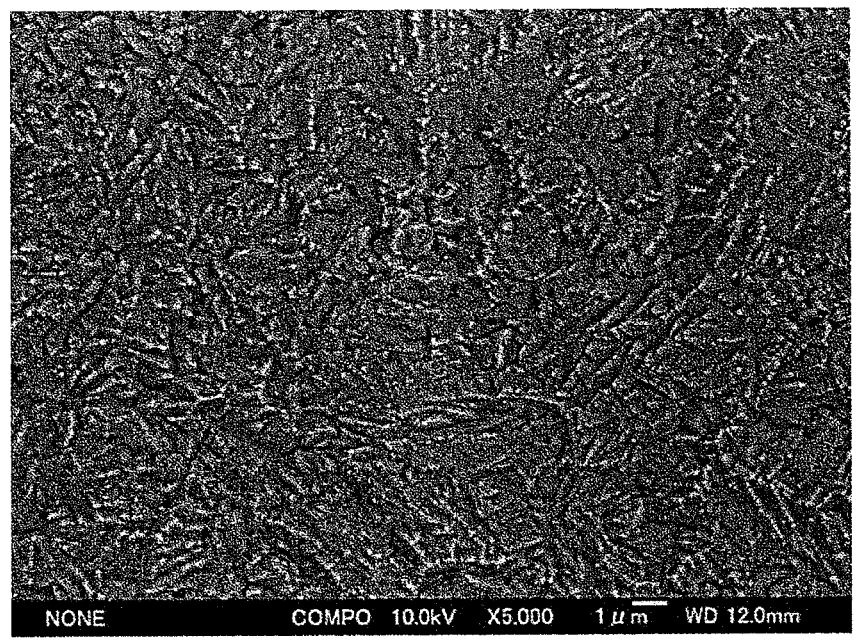
(b)
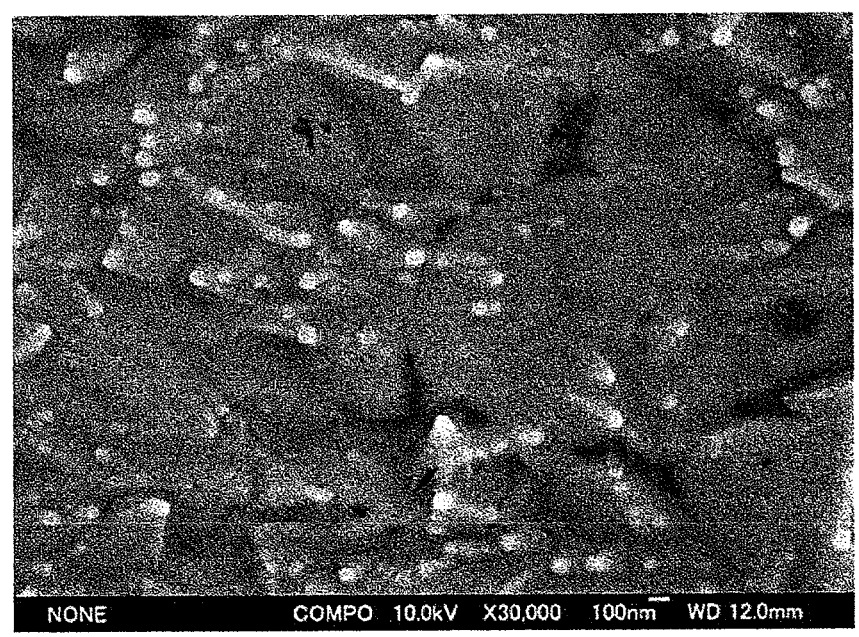

[Figure 4]
(a)
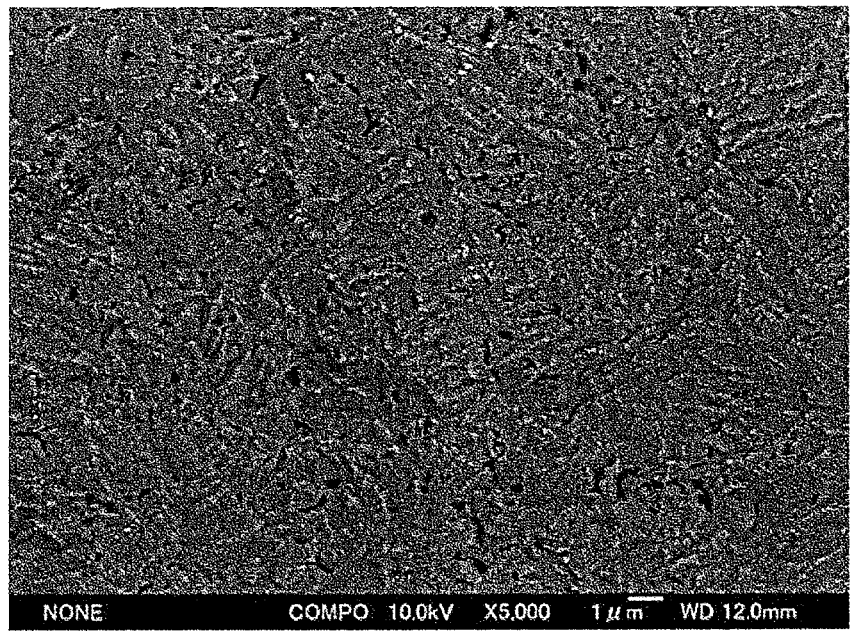
(b)
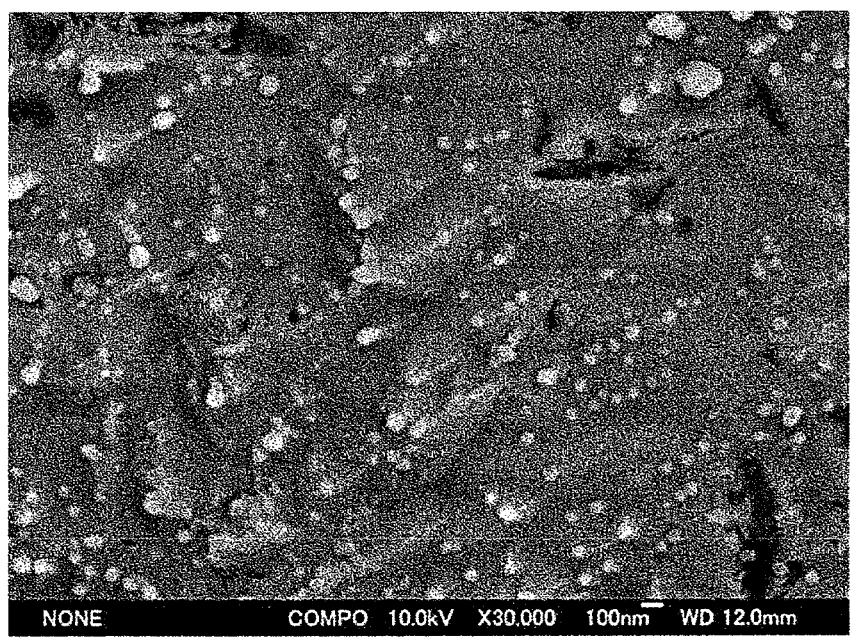

[Figure 5]
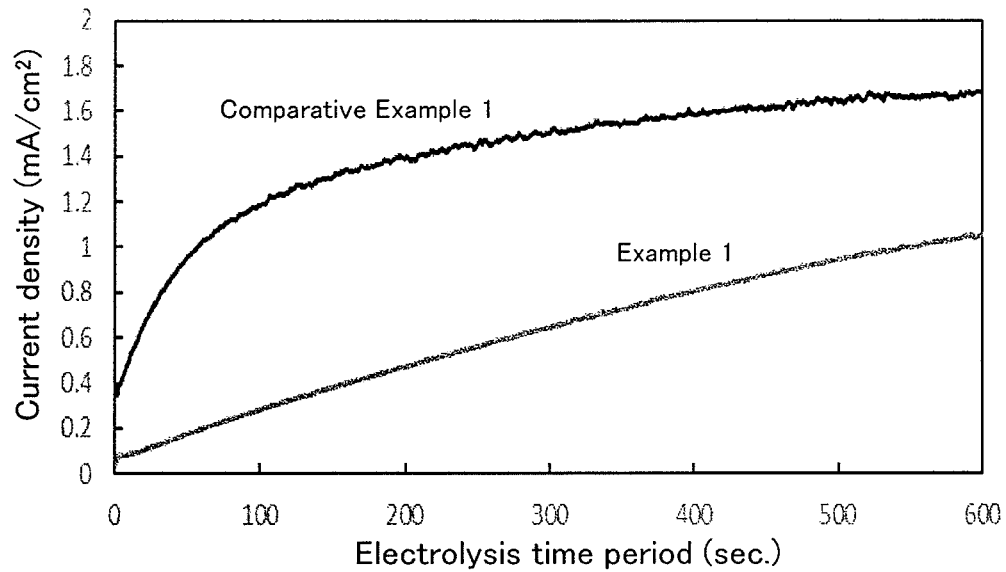
[Figure 6]
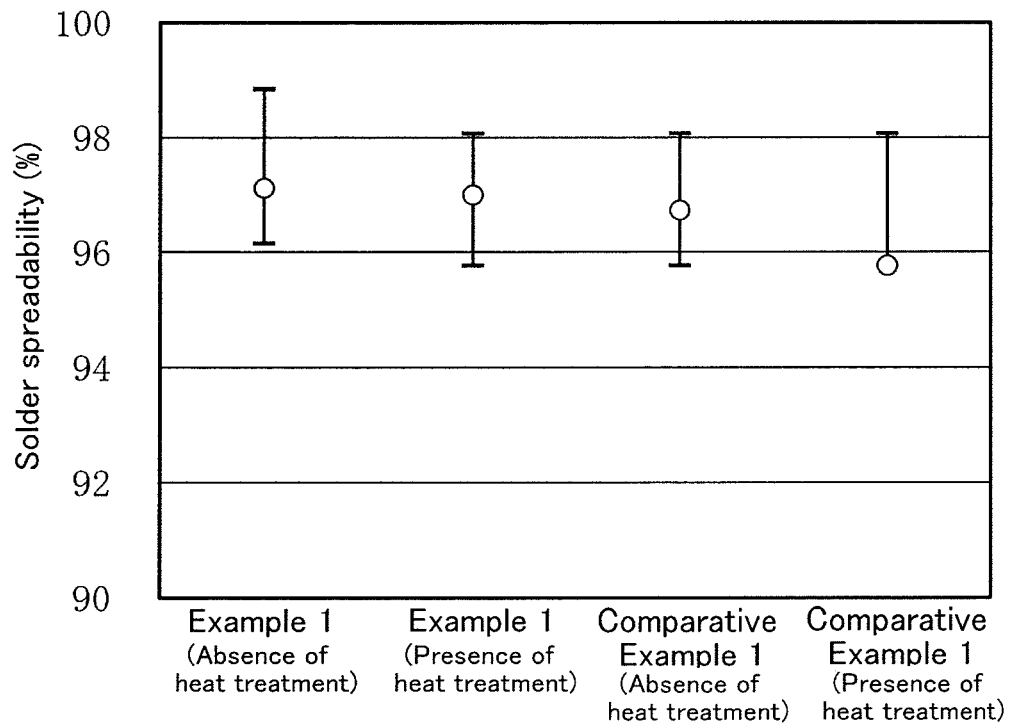

[Figure 7]
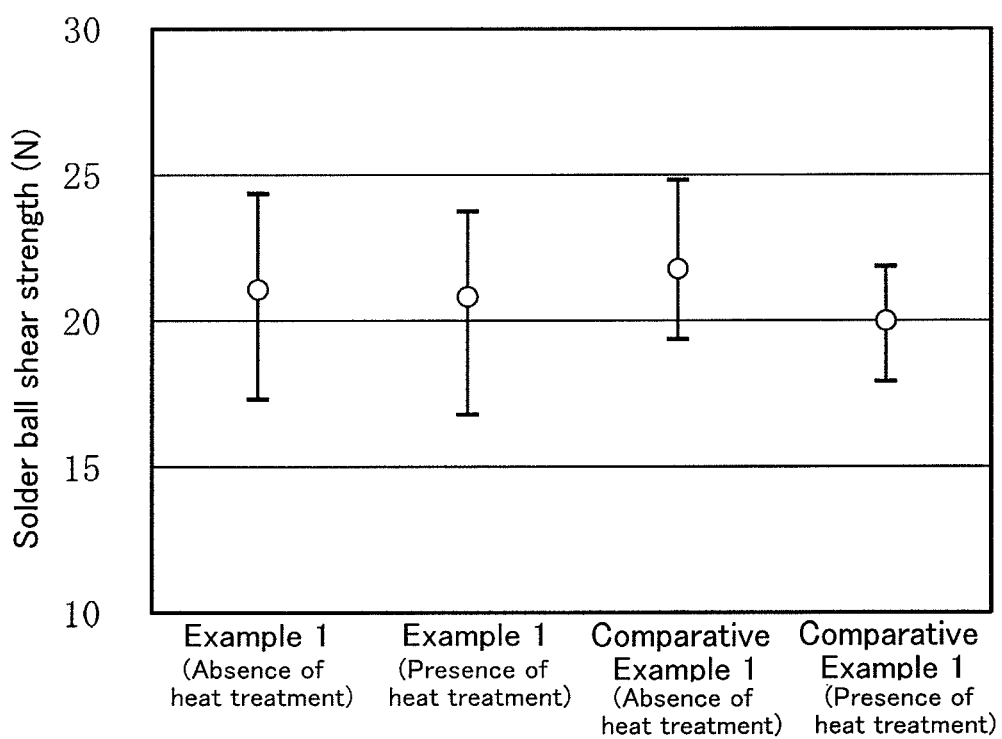

[Figure 8]
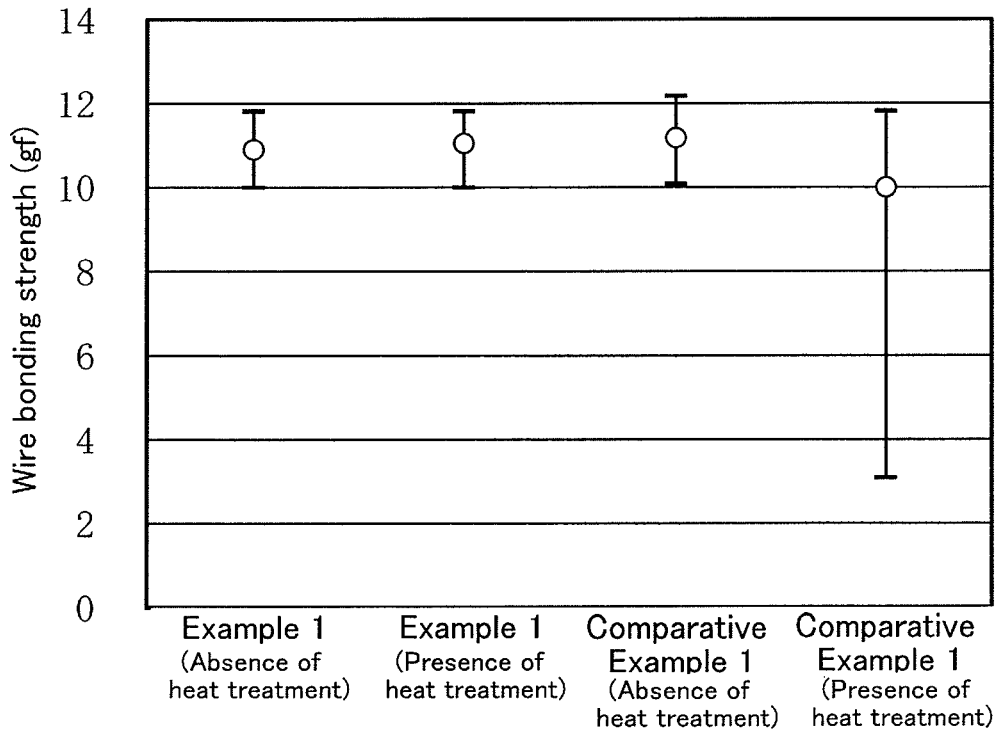
[Figure 9]
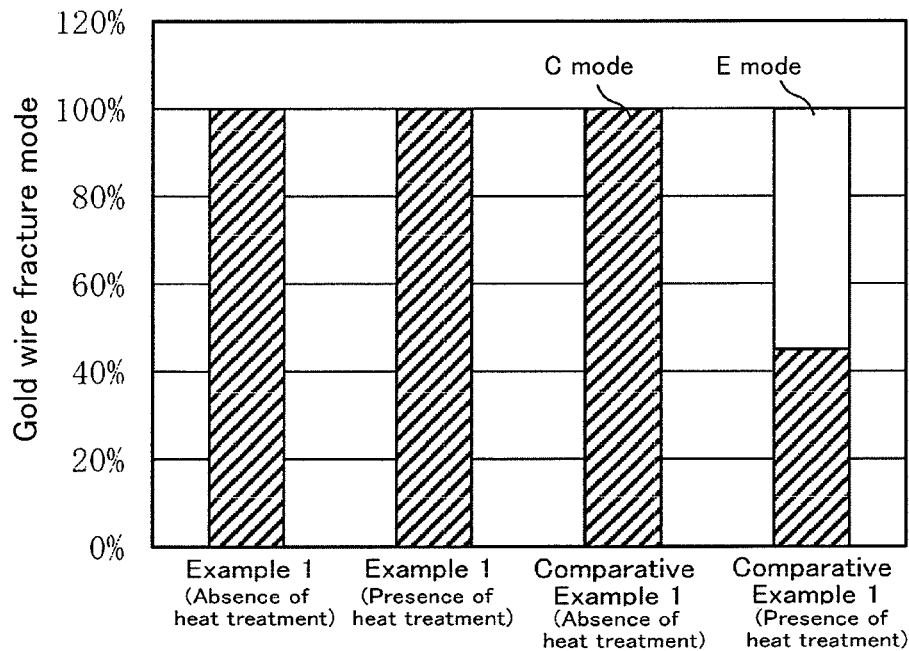

[Figure 10]
RELATED ART
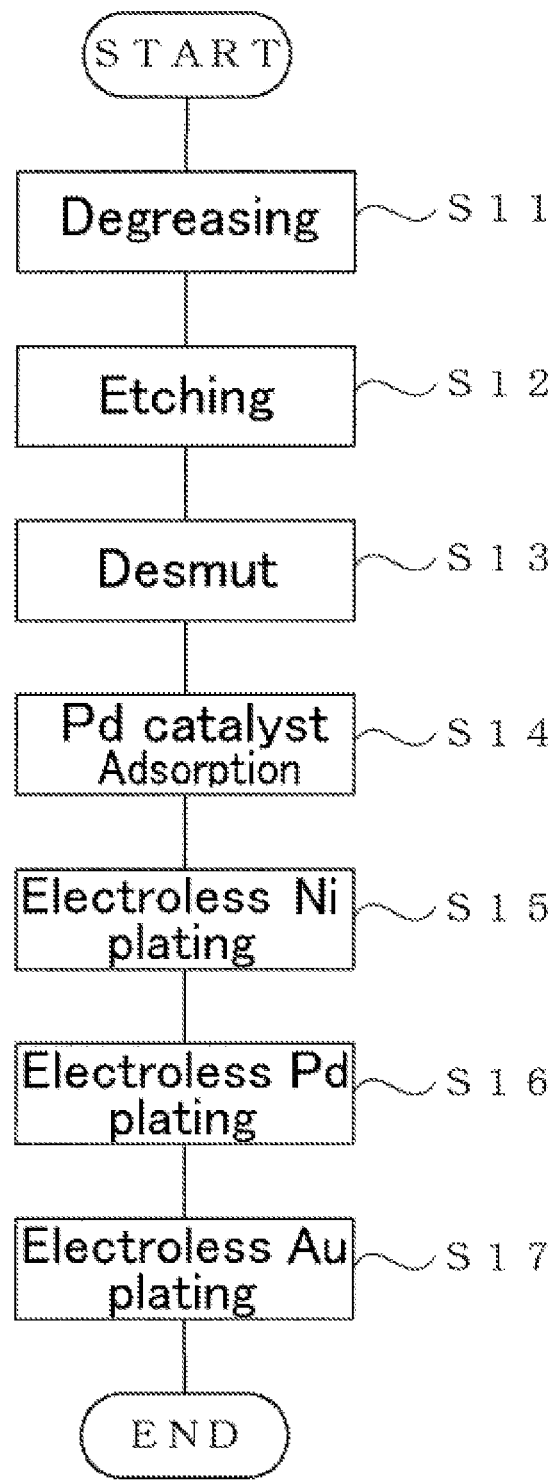

ELECTROLESS PLATING PROCESS

TECHNICAL FIELD

The present invention relates to an electroless plating process for forming a gold film on a surface of a copper material by an electroless plating method.

BACKGROUND ART

In recent years, demands have been increasing for a higher function and more multiple function of electronic equipment, but electronic circuit boards such as a resin substrate, a ceramic substrate and a wafer substrate, which are used in these electronic equipment, are required to become further lighter, thinner, shorter and smaller. In order to cope with this tendency of being lighter, thinner, shorter and smaller, high density mounting of electronic parts is necessary, and accordingly a surface treatment technology is required which can achieve the high density mounting. In addition, in a technological field of electronic circuit boards, a mounting technology using solder or wire bonding has been established as a technology for bonding mounted components.

For the purpose of ensuring the connection reliability at the time of mounting, plating treatment is performed as surface treatment, on a wiring pad which is a mounting portion of a circuit pattern on an electronic circuit board. For example, a nickel film and a gold film are sequentially formed by plating treatment, on a circuit pattern which is formed of a low resistance metal such as copper. Hereinafter, a film formed of the nickel film and the gold film which have been sequentially formed will be described as "Ni/Au film". The nickel film is formed so as to prevent the diffusion of copper into the gold film, and the gold film is formed so as to obtain adequate mounting characteristics.

Furthermore, a technology of forming a palladium film between a nickel film and a gold film is also known. Hereinafter, a film formed of the nickel film, the palladium film and the gold film which have been sequentially formed will be described as "Ni/Pd/Au film". The palladium film is formed in order to prevent nickel from diffusing into the gold film when the plated substrate is heat treated. When the palladium film has been formed on the nickel film, it becomes possible to thin the nickel film.

As the above described plating treatment, an electrolytic plating process is the mainstream, but an electroless plating process is applied to those which the electrolytic plating process cannot cope with.

As for a conventional electroless plating process for forming an Ni/Pd/Au film on the surface of copper, for example, such a process is disclosed in Patent Literature 1 for performing a degreasing step (step (hereinafter referred to as "S") 11) and etching (S12) onto a copper material, as shown in FIG. 10, adsorbing a palladium catalyst to a surface of the copper material (S14), and then performing electroless nickel (Ni) plating (S15), electroless palladium (Pd) plating (S16) and electroless gold (Au) plating (S17). Although not described in Patent Literature 1, it is general to perform desmut (S13) between etching (S12) and palladium catalyst adsorption treatment (S14). The palladium catalyst adsorption treatment (S14) is usually essential for progressing nickel deposition at the time of electroless nickel plating (S15).

In the electroless nickel plating (S15) disclosed in Patent Literature 1, an electroless nickel plating solution is used which contains nickel sulfate hexahydrate in a concentration of 22.5 g/L (5 g/L in terms of nickel), sodium hypophosphite as a reducing agent, malic acid and succinic acid as complexing agents, also contains a lead salt, a bismuth salt, a sulfur compound or the like as stabilizers, and has a pH adjusted to 4.6 and a bath temperature adjusted to 60 to 90° C. It is also possible to use dimethylamine borane in place of sodium hypophosphite, as the reducing agent. Then, it is described that a nickel film of which the film thickness is 0.1 to 15 μm is formed by the electroless nickel plating (S15), a palladium film of which the film thickness is 0.001 to 2 μm is formed by electroless palladium plating (S16), and a gold film of which the film thickness is 0.001 to 1 μm is formed by electroless gold plating (S17).

In order to achieve further high density mounting of electronic parts in the Ni/Au film or the Ni/Pd/Au film, it is desired to further thin the nickel film.

CITATION LIST

Patent Literature

[Patent Literature 1] Japanese Patent Laid-Open No. 2008-174774

SUMMARY OF INVENTION

Technical Problem

However, when an extremely thin nickel film of which the film thickness is, for example, 0.01 μm or less is formed by the above described electroless nickel plating (S15), there is a case where the covering becomes insufficient and a non-deposition superfine area (hole) is formed on the surface of the nickel film. Then, when the subsequent electroless gold plating (S17) has been performed, there is a case where the non-deposition superfine area is corroded and a through hole is formed which penetrates through the nickel film. This phenomenon is referred to as "nickel local corrosion phenomenon". In that case, there is a disadvantage in the Ni/Au film or the Ni/Pd/Au film that excellent mounting characteristics cannot be obtained.

An object of the present invention is to provide an electroless plating process which can thin a film thickness of a nickel film and can obtain a film having excellent mounting characteristics, when the nickel film and the gold film are sequentially formed on a surface of a copper material.

Solution to Problem

The electroless plating process according to the present invention is an electroless plating process for sequentially forming a nickel film and a gold film on a surface of a copper material by an electroless plating method, and includes: a step of forming the nickel film on the surface of the copper material by an electroless strike plating method; and a step of forming the gold film by a reduction-type electroless plating method.

In the electroless plating process according to the present invention, it is preferable to perform the electroless strike plating method by using an electroless nickel strike plating solution that contains a water-soluble nickel salt in a concentration of 0.002 to 1 g/L in terms of nickel, a carboxylic acid or a salt thereof, and one or more reducing agents selected from the group of dimethylamine borane, trimethylamine borane, hydrazine and a hydrazine derivative, and has a pH adjusted to 6 to 10 and a bath temperature adjusted to 20 to 55° C., and immersing the copper material in the electroless nickel strike plating solution.

In addition, it is preferable that the electroless nickel strike plating solution is prepared by mixing and stirring the water-soluble nickel salt, the carboxylic acid or the salt thereof and water to prepare an aqueous solution containing a nickel complex, then mixing the reducing agent into the aqueous solution, and stirring the mixture.

In the electroless plating process according to the present invention, it is preferable that the step of forming the nickel film is a step of forming a nickel film of which the film thickness is 0.005 to 0.3 μm.

Furthermore, it is preferable that the electroless plating process according to the present invention is a process for sequentially forming a nickel film, a palladium film and a gold film on a surface of a copper material, and includes a step of forming a palladium film by a reduction-type electroless plating method between the step of forming the nickel film and the step of forming the gold film.

Advantageous Effects of Invention

The electroless plating process according to the present invention adopts the electroless strike plating method, and thereby can directly form the nickel film on the surface of the copper material even without performing the palladium catalyst adsorption treatment (S14) which has been performed in a conventional electroless plating process. In addition, it is possible to form a nickel film which surely covers the surface of the copper material even though the film thickness is thin, and is excellent in adhesiveness to the copper material. Because of this, according to the electroless plating process of the present invention, it is possible to achieve the thinning of the nickel film. In addition, the electroless plating process according to the present invention adopts the reduction-type electroless plating method, and thereby can form the gold film or the palladium film without dissolving a metal of the film which has been precedingly formed. According to the electroless plating process of the present invention, it is possible to obtain an Ni/Au film or Ni/Pd/Au film which is excellent in mounting characteristics.

BRIEF DESCRIPTION OF DRAWINGS

FIG. 1 is a flowchart showing an electroless plating process of the present embodiment.

FIG. 2 is an SEM photograph of a nickel film obtained by an electroless plating process of Example 1.

FIG. 3 is an SEM photograph of a nickel film obtained by an electroless plating process of Comparative Example 1.

FIG. 4 is an SEM photograph of a nickel film obtained by an electroless plating process of Comparative Example 2.

FIG. 5 is a graph showing results of having electrolyzed the nickel films obtained by the electroless plating processes of Example 1 and Comparative Example 1, at a low potential.

FIG. 6 is a graph showing solder spreadabilities of Ni/Pd/Au films obtained by the electroless plating processes of Example 1 and Comparative Example 1.

FIG. 7 is a graph showing solder ball shear strengths of the Ni/Pd/Au films obtained by the electroless plating processes of Example 1 and Comparative Example 1.

FIG. 8 is a graph showing wire bonding strengths of the Ni/Pd/Au films obtained by the electroless plating processes of Example 1 and Comparative Example 1.

FIG. 9 is a graph showing gold wire fracture modes of the Ni/Pd/Au films obtained by the electroless plating processes of Example 1 and Comparative Example 1.

FIG. 10 is a flowchart showing an electroless plating process of a conventional technology.

DESCRIPTION OF EMBODIMENTS

Next, an embodiment of the electroless plating process according to the present invention will be described. The electroless plating process of the present embodiment is an electroless plating process for sequentially forming a nickel film and a gold film on a surface of a copper material of an electrode, a wire and the like which have been provided on a surface of an insulating base material, for example, such as a resin substrate, a ceramic substrate and a wafer substrate, by an electroless plating method. Specifically, the electroless plating process is an electroless plating process including a step of forming the nickel film on the surface of the copper material by an electroless strike plating method, and a step of forming the gold film by a reduction-type electroless plating method. Hereinafter, an electroless plating process will be described which forms an Ni/Pd/Au film on the surface of the copper material by sequentially forming the nickel film, the palladium film and the gold film on the surface of the copper material.

In the electroless plating process of the present embodiment, firstly, as shown in FIG. 1, a degreasing step (S1), an etching step (S2) and a desmutting step (S3) are carried out as pretreatment before the nickel film is formed. After that, the nickel film is formed on the surface of the copper material in an electroless nickel (Ni) strike plating step (S4). Subsequently, the palladium film is formed in an electroless palladium (Pd) plating step (S5), and the gold film is formed in an electroless gold (Au) plating step (S6). Water washing treatment is performed after each step. It is preferable to perform the water washing treatment three times.

1. Degreasing Step (S1)

In the degreasing step (S1), the copper material is immersed in an acidic solution, and an oil and fat content is removed which adheres to a surface of the copper material.

2. Etching Step (S2)

In the etching step (S2), the copper material which has been subjected to the degreasing step (S1) is immersed in an etching solution such as a persulfate-based solution, a hydrogen peroxide-based solution, and a thiol-based solution, and a copper oxide film is removed which is formed on a surface of the copper material.

3. Desmutting Step (S3)

In the desmutting step (S3), the copper material which has been subjected to the etching step (S2) is immersed in, for example, 10% sulfuric acid, and a smut is removed which adheres to a surface of the copper material.

4. Electroless Nickel Strike Plating Step (S4)

In the electroless nickel strike plating step (S4), a nickel film is formed on a surface of the pretreated copper material, by the electroless strike plating method. The electroless strike plating method is performed by immersing the copper material which has been subjected to the desmutting step (S3), in an electroless nickel strike plating solution.

Electroless Nickel Strike Plating Solution:

The electroless nickel strike plating solution contains a water-soluble nickel salt, a carboxylic acid or a salt thereof, and one or more reducing agents selected from the group of dimethylamine borane, trimethylamine borane, hydrazine and a hydrazine derivative. In the present specification, "one or more" means that it may be only one, or be two or more.

Water-Soluble Nickel Salt:

Examples of the water-soluble nickel salts to be used in the electroless nickel strike plating solution include nickel sulfate, nickel chloride, nickel carbonate, and nickel salts of organic acids such as nickel acetate, nickel hypophosphite, nickel sulfamate and nickel citrate. These may be used singly or in combinations of two or more. In the present invention, it is most preferable to use the nickel sulfate hexahydrate as the water-soluble nickel salt.

As for the electroless nickel strike plating solution, it is preferable that the content of the water-soluble nickel salt is in a range of 0.002 to 1 g/L in terms of nickel. The content within the above range is ⅕ or less of a nickel concentration of 5 g/L in the electroless nickel plating solution which is used in the electroless nickel plating (S15) of the electroless plating process of the conventional technology, and is considerably low concentration. The electroless nickel strike plating solution achieves the electroless strike plating method if the content of the water-soluble nickel salt in terms of nickel is within the above described range, and can directly form the nickel film on a surface of a copper material to which a palladium catalyst is not adsorbed.

It is not preferable that the content of the water-soluble nickel salt is less than 0.002 g/L in terms of nickel, because a deposition rate becomes excessively low, and accordingly it becomes necessary to lengthen an immersion time period in order to obtain a nickel film of a desired film thickness, which cannot satisfy the industrial productivity. On the other hand, it is not preferable that the content of the water-soluble nickel salt exceeds 1 g/L in terms of nickel, because the deposition rate becomes excessively high, and there is a case where a nickel film of which the surface is uniform cannot be obtained. It is more preferable for the content of the water-soluble nickel salt in terms of nickel to be in a range of 0.01 to 0.5 g/L, and is most preferable to be in a range of 0.03 to 0.1 g/L.

Carboxylic Acid or a Salt Thereof:

The electroless nickel strike plating solution contains a carboxylic acid or a salt thereof. They act as complexing agents and pH adjusting agents. As the carboxylic acid, one or more can be used which are selected from: monocarboxylic acids (formic acid, acetic acid, propionic acid, butyric acid and the like); dicarboxylic acids (oxalic acid, malonic acid, succinic acid, gluconic acid, adipic acid, fumaric acid, maleic acid, succinic acid and the like); tricarboxylic acids (aconitic acid and the like); hydroxycarboxylic acids (citric acid, lactic acid and malic acid); aromatic carboxylic acids (benzoic acid, phthalic acid, salicylic acid and the like); oxocarboxylic acids (pyruvic acid and the like); and amino acids (arginine, asparagine, aspartic acid, cysteine, glutamic acid, glycine and the like).

It is preferable to use the carboxylic acid or a salt thereof in a range of 0.5 to 5 g/L in total, and is more preferable to use the carboxylic acid or a salt thereof in a range of 0.8 to 2 g/L. In the electroless nickel strike plating solution of the present embodiment, the nickel content is lower than that of the electroless nickel plating solution which is used in the electroless nickel plating (S15) of the electroless plating process of the conventional technology, and accordingly the content of the carboxylic acid or the salt thereof is set low. It is not preferable that the content of the carboxylic acid or the salt thereof is less than 0.5 g/L, though depending on the type, because it becomes insufficient for nickel ions in the electroless nickel strike plating solution to form complexes, and precipitation occasionally occurs. On the other hand, it is also not preferable that the content of the carboxylic acid or the salt thereof exceeds 5 g/L, because not only a special effect cannot be obtained but also resources are wasted.

Reducing Agent:

The electroless nickel strike plating solution contains one or more reducing agents selected from the group of dimethylamine borane, trimethylamine borane, hydrazine and a hydrazine derivative. The electroless nickel strike plating solution can achieve the nickel deposition on a surface of a copper material to which the palladium catalyst is not adsorbed, by using these substances as reducing agents. From the viewpoint of safety to the human body, the dimethylamine borane and the trimethylamine borane are more preferable.

It is preferable to use the reducing agent in a range of 2 to 10 g/L, and is more preferable to use the agent in a range of 4 to 8 g/L. It is not preferable that the content of the above described reducing agent is less than 2 g/L, because there is a case where a sufficient reducing action cannot be obtained and the nickel deposition on the copper surface does not progress. It is not preferable that the content of the above described reducing agent exceeds 10 g/L, because there is a case where nickel abnormally deposits on another surface than that of copper (surface of insulating base material), or the decomposition of a bath of the electroless nickel strike plating solution occurs.

The electroless nickel strike plating solution is prepared by mixing the above described components with water, stirring the mixture and dissolving the components. It is more preferable that the electroless nickel strike plating solution is prepared by mixing and stirring the above described water-soluble nickel salt, the above described carboxylic acid or a salt thereof, and water to prepare an aqueous solution containing a nickel complex, then mixing the above described reducing agent into the aqueous solution, and stirring the mixture. In the electroless nickel strike plating solution thus prepared, the nickel complex can stably exist for a long period of time, and excellent bath stability can be obtained.

Besides the above described components, the electroless nickel strike plating solution may contain components such as a sulfate, boric acid and a chloride salt.

pH:

It is preferable that a pH of the electroless nickel strike plating solution is adjusted to a neutral region of 6 to 10. It is not preferable that the pH is lower than 6, because the deposition rate of nickel decreases and the forming property of the nickel film lowers, and pores and non-deposition superfine areas (holes) are occasionally formed on the surface of the nickel film. On the other hand, it is not preferable that the pH exceeds 10, because there are cases where the deposition rate of nickel becomes excessively high, which makes it difficult to control the film thickness of the nickel film, and the crystalline state of depositing nickel cannot be densified.

Bath Temperature:

It is preferable that the bath temperature of the electroless nickel strike plating solution is adjusted to 20 to 55° C. This is a value lower than the bath temperature of 60 to 90° C. in the electroless nickel plating solution which is used in the electroless nickel plating (S15) of the conventional technology. It is not preferable that the bath temperature is lower than 20° C., because the deposition rate of nickel decreases, the forming property of the nickel film lowers, and there is a case where pores and non-deposition superfine areas (holes) are formed on the surface of the nickel film, or no nickel deposition occurs. On the other hand, it is not preferable that the bath temperature exceeds 55° C., because the bath stability of the electroless nickel strike plating solution decreases, and the electroless strike plating method cannot be occasionally achieved.

Film Thickness:

The film thickness of the nickel film is adjusted by the immersion time period in the electroless nickel strike plating solution. It is preferable for the film thickness of the nickel film to be as thin as possible within a range that can prevent copper diffusion, and is preferable to be 0.005 to 0.3 µm. It is not preferable that the film thickness of the nickel film is less than 0.005 µm, because it becomes insufficient to cover the surface of the copper material, non-deposition superfine areas are formed on the surface of the nickel film, and as a result, there are cases where the nickel local corrosion phenomenon occurs when the subsequent electroless gold plating step (S6) has been performed, and copper and nickel diffuse into the surface of the gold film. On the other hand, it is possible to form a nickel film of which the film thickness exceeds 0.3 µm, but is not preferable because the flexibility of the nickel film lowers, and besides, resources are wasted.

According to the electroless nickel strike plating step (S4) of the present embodiment, it is possible to achieve the thinning of the nickel film, which has been difficult for the conventional electroless nickel plating (S15), and is possible to obtain a nickel film of which the film thickness is 0.005 to 0.3 µm. Furthermore, in order to achieve the thinning of the film while ensuring favorable mounting characteristics, it is more preferable that the film thickness of the nickel film which is formed in the electroless nickel strike plating step (S4) is 0.007 to 0.1 µm.

In the electroless nickel strike plating step (S4) of the present embodiment, one or more substances selected from the group of dimethylamine borane, trimethylamine borane, hydrazine and a hydrazine derivative which are contained in the electroless nickel strike plating solution act as reducing agents, and can make nickel deposit on a surface of the copper material to which the palladium catalyst is not adsorbed. In addition, the nickel content of the electroless nickel strike plating solution is low; and besides, the pH is adjusted to 6 to 10, and the bath temperature is adjusted to 20 to 55° C. Thereby, the deposition rate of nickel can be lowered, the electroless strike plating method can be achieved, and the nickel film can be directly formed on the surface of the copper material. At this time, the deposition rate of nickel is low, accordingly it is possible to uniformly deposit nickel on the surface of the copper material, and as a result, it is possible to form a nickel film which is uniform in film thickness, and surely covers the surface of the copper material even though the film thickness is thin. The obtained nickel film is excellent in adhesiveness to the copper material and excellent in barrier properties, i.e., prevention of the diffusion of copper, as compared with the nickel film which has been obtained in the conventional electroless plating process.

In contrast to this, in the electroless nickel plating (S15) which is performed in the electroless plating process of the conventional technology, the palladium which has been adsorbed on the surface of the copper material by the palladium catalyst adsorption treatment (S14) acts as a catalyst, and the nickel deposition progresses. Because of this, variations of the film thicknesses of the nickel film to be formed occur between a region in which the palladium catalyst has been adsorbed and a region in which the palladium catalyst has not been adsorbed, on the surface of the copper material, and it is difficult to obtain the nickel film of which the film thickness is uniform. Furthermore, in the electroless nickel plating solution which is used in the electroless nickel plating (S15), the nickel content and the bath temperature are high, accordingly the deposition rate of nickel is high, and accordingly it is difficult to obtain the nickel film excellent in the adhesiveness to the copper material.

According to the electroless nickel strike plating step (S4) of the present embodiment, when the dimethylamine borane or the trimethylamine borane is used as a reducing agent, it is possible to obtain a nickel film formed from an alloy of nickel and boron (nickel-boron alloy). This nickel film contains a very small amount of boron (for example, 0.1% or less), and is a nickel film which is substantially formed of pure nickel. In addition, when the hydrazine or the hydrazine derivative is used as a reducing agent, it is possible to obtain a nickel film formed of pure nickel.

In addition, in the electroless nickel strike plating step (S4), the content of the water-soluble nickel salt in the above described electroless nickel strike plating solution is as low as 0.002 to 1 g/L. Because of this, it is possible to prevent the bath decomposition from occurring even without using a stabilizer such as a lead salt or bismuth salt which is used in the electroless nickel plating (S15) of the electroless plating process of the conventional technology. In addition, the above described electroless nickel strike plating solution does not contain the stabilizer such as the lead salt and the bismuth salt, and accordingly it is possible to obtain a nickel film which does not contain a heavy metal such as lead and bismuth.

5. Electroless Palladium Plating Step (S5)

In the electroless palladium plating step (S5), a palladium film is formed on the surface of the above described nickel film by a reduction-type electroless plating method. When a palladium film is formed by a substitution-type electroless plating method, there is a case where a nickel local corrosion phenomenon occurs, specifically, a phenomenon in which nickel dissolves and a through hole penetrating the nickel film is formed occurs; and accordingly the reduction-type electroless plating method is adopted.

As the reduction-type electroless palladium plating solution which is used in the electroless palladium plating step (S5), a known plating solution can be used. For example, it is possible to use a reduction-type electroless palladium plating solution which contains 0.001 to 0.1 mol/L of a palladium compound, 0.05 to 5 mol/L of an amine compound, 0.01 to 0.1 mol/L of an inorganic sulfur compound, and 0.05 to 1.0 mol/L of hypophosphorous acid or a hypophosphorous acid compound. Alternatively, it is possible to use a reduction-type electroless palladium plating solution which contains 0.001 to 0.1 mol/L of formic acid or a formic acid compound, in place of the hypophosphorous acid or the hypophosphorous acid compound.

In the electroless palladium plating step (S5), the reduction-type electroless plating method is adopted, and thereby it becomes possible to prevent the dissolution of nickel from the nickel film when forming the palladium film. In addition, in the electroless plating process of the present embodiment, the nickel film which has been formed by the electroless nickel strike plating step (S4) is uniform in film thickness and is excellent in smoothness, and accordingly it is possible to form a palladium film having a uniform film thickness, according to the electroless palladium plating step (S5).

6. Electroless Gold Plating Step (S6)

In the electroless gold plating step (S6), a gold film is formed on the surface of the above described palladium film by a reduction-type electroless plating method. When the gold film is formed by the substitution-type electroless plating method, there is a case where palladium dissolves and a through hole is formed in the palladium film; and accordingly the reduction-type electroless plating method is adopted.

As the reduction-type electroless gold plating solution which is used in the electroless gold plating step (S6), a known plating solution can be used. For example, it is possible to use a reduction-type electroless gold plating solution that contains: a water-soluble gold compound; citric acid or a salt thereof; ethylenediaminetetraacetic acid or a salt thereof; hexamethylenetetramine as a reducing agent; and chain polyamine which contains an alkyl group having 3 or more carbon atoms, and 3 or more amino groups.

In the electroless gold plating step (S6), the reduction-type electroless plating method is adopted, and thereby it becomes possible to prevent the dissolution of palladium from the palladium film when forming the gold film. In addition, in the electroless plating process of the present embodiment, the palladium plating which has been formed by the electroless palladium plating step (S4) has a uniform film thickness, and accordingly it is possible to form a gold film having a uniform film thickness, according to the electroless gold plating step (S6).

After the electroless gold plating step has been finished, water washing treatment is performed, and the obtained film is dried. As described above, it is possible to form an Ni/Pd/Au film on the surface of the copper material, by performing the electroless plating process shown in FIG. 1.

In the electroless plating process of the present embodiment, it is possible to form the nickel film directly on the surface of the copper material to which the palladium catalyst is not adsorbed, by the electroless nickel strike plating step (S4). In addition, it is possible to form a nickel film which surely covers the surface of the copper material even though the film thickness is thin, and is excellent in the adhesiveness to the copper material and the barrier properties. Accordingly, it is possible to achieve the thinning of the nickel film.

Furthermore, it is possible to thin the film thickness of the nickel film, and accordingly it is possible to obtain an Ni/Pd/Au film of which the overall film thickness is thin. In addition, it is possible to obtain a nickel film which is uniform in the film thickness and is excellent in smoothness, by the electroless nickel strike plating step (S4), accordingly it is possible to form the palladium film and the gold film which are formed thereon so as to be also uniform in film thickness, and it is possible to form an Ni/Pd/Au film of which the dispersion of the film thickness is small. Furthermore, the nickel film which has been formed by the electroless strike plating method is excellent in the adhesiveness to the copper material and excellent in the barrier properties of preventing the diffusion of copper, and accordingly it is possible to form the Ni/Pd/Au film having excellent mounting characteristics.

In addition, the above described nickel film has a thin film thickness, and besides, does not contain phosphor unlike the nickel film which is formed by the electroless nickel plating (S15) of the conventional technology. From this result, the above described nickel film can obtain excellent flexibility, and accordingly the Ni/Pd/Au film can obtain the excellent flexibility.

Furthermore, in the electroless plating process of the present embodiment, unlike the electroless plating process of the conventional technology, there is no need to perform the palladium catalyst adsorption treatment (S14) before the electroless nickel strike plating step (S4), and it is possible to reduce the number of steps.

The above described electroless plating process of the present embodiment is a process for performing the electroless palladium plating step (S5) and the electroless gold plating step (S6) after the electroless nickel strike plating step (S4). The electroless plating process of the present embodiment may be a process for performing the electroless gold plating step (S6) without performing the electroless palladium plating step (S5), after the electroless nickel strike plating step (S4), and thereby forming an Ni/Au film on the surface of the copper material.

Hereinafter, the present invention will be specifically described on the basis of examples and the like.

Example 1

In an electroless plating process of the present example, an Ni/Pd/Au film was formed on a surface of a copper material by sequentially performing each step of S1 to S6 (6 steps in all) shown in FIG. 1. After the above described degreasing step (S1), the etching step (S2) and the desmutting step (S3) were sequentially performed, and then the electroless nickel strike plating step (S4) was performed. In the electroless nickel strike plating step (S4), the copper material was immersed in an electroless nickel strike plating solution having the following composition, and a nickel film was formed on the surface of the copper material. The electroless nickel strike plating solution was prepared by mixing and stirring nickel sulfate hexahydrate, DL-malic acid and water to prepare an aqueous solution containing a nickel complex, then adding dimethylamine borane, and stirring the mixture. While the copper material was immersed in the electroless nickel strike plating solution, the electroless nickel strike plating solution was stirred by aeration.

(Electroless Nickel Strike Plating Solution)
Nickel sulfate hexahydrate 0.2 g/L (0.045 g/L in terms of nickel)
DL-malic acid 1.0 g/L
Dimethylamine borane 4.0 g/L
pH 9.0
Bath temperature 50° C.

Subsequently, an electroless palladium plating step (S5) was performed. A copper material on which the nickel film was formed was immersed in a reduction-type electroless palladium plating solution having the following composition, and a palladium film was formed on the surface of the nickel film.

(Reduction-Type Electroless Palladium Plating Solution)
Palladium chloride 0.038 mol/L
Ethylenediamine 0.142 mol/L
Sodium formate 0.294 mol/L
pH 6.0
Bath temperature 70° C.

After that, an electroless gold plating step (S6) was performed. A copper material on which the palladium film was formed was immersed in a reduction-type electroless gold plating solution having the following composition, and a gold film was formed on the surface of the palladium film. By the above steps, the Ni/Pd/Au film was formed on the surface of the copper material.

(Reduction-Type Electroless Gold Plating Solution)
Gold potassium cyanide 5 mmol/L
Dipotassium ethylenediaminetetraacetate 0.03 mol/L
Citric acid 0.15 mol/L
Hexamethylenetetramine 3 mmol/L
3,3'-Diamino-N-methyldipropylamine 0.02 mol/L
Thallium acetate 5 mg/L pH 8.5
Bath temperature 80° C.

COMPARATIVE EXAMPLES

Comparative Example 1

In an electroless plating process of the present comparative example, an Ni/Pd/Au film was formed on a surface of a copper material in exactly the same way as that of the electroless plating process of Example 1, except that in place of the electroless nickel strike plating step (S4), the palladium catalyst adsorption treatment (S14) and the electroless nickel plating (S15) were performed which are performed in the electroless plating process of a conventional technology. The steps of the electroless plating process of the present comparative example were 7 steps in all.

In the palladium catalyst adsorption treatment (S14), a desmutted copper material was immersed in a palladium catalyst solution containing a palladium compound in a concentration of 30 mg/L in terms of palladium and sulfate ions, and a palladium catalyst was absorbed on the surface of the copper material.

In the electroless nickel plating (S15), a copper material to which the palladium catalyst was adsorbed was immersed in an electroless nickel plating solution having the following composition.

(Electroless Nickel Plating Solution)
Nickel sulfate hexahydrate 22.4 g/L (5 g/L in terms of nickel)
DL-malic acid 15 g/L
Lactic acid 18 g/L
Sodium hypophosphite 30 g/L
pH 4.5
Bath temperature 80° C.

Comparative Example 2

An electroless plating process of the present comparative example was performed in exactly the same way as that of Comparative Example 1, except that an electroless nickel plating solution having the following composition was used in the electroless nickel plating (S15). The steps of the electroless plating process of the present comparative example were 7 steps in all.

(Electroless Nickel Plating Solution)
Nickel sulfate hexahydrate 22.4 g/L (5 g/L in terms of nickel)
Glycolic acid 30 g/L
Acetic acid 15 g/L
Dimethylamine borane 2.5 g/L
pH 6.0
Bath temperature 60° C.

Reference Example 1

An electroless plating process of the present reference example was performed in exactly the same way as that of the Comparative Example 1, except that the palladium catalyst adsorption treatment (S14) was not performed before the electroless nickel plating (S15) was performed. The steps of the electroless plating process of the present reference example were 6 steps in all.

Reference Example 2

An electroless plating process of the present reference example was performed in exactly the same way as that of the Comparative Example 2, except that the palladium catalyst adsorption treatment (S14) was not performed before the electroless nickel plating (S15) was performed.

<Evaluation>

1. Evaluation for Nickel Film

Firstly, a nickel film of which the film thickness is 0.01 μm was formed on a surface of a copper material, by performing the steps up to the electroless nickel strike plating step (S4) in the electroless plating process of Example 1, or by performing the steps up to the electroless nickel plating (S15) in the electroless plating processes of Comparative Example 1 and Comparative Example 2. The obtained nickel film was subjected to the following evaluations.

1-1. Nickel Deposition Property

Here, a test board was used in which 30 copper pads of which the diameter is 0.45 mm are arranged on an insulating base material in a lattice pattern at spaces of 30 μm. Then, a nickel film was formed on the surface of the copper pad, by performing the steps up to the electroless nickel strike plating step (S4) in the electroless plating process of Example 1, or by performing the steps up to the electroless nickel plating (S15) in the electroless plating processes of Comparative Example 1 and Comparative Example 2. On the other hand, in the electroless plating processes of Reference Example 1 and Reference Example 2, the steps up to the electroless nickel plating (S15) were performed, but nickel was not deposited at all on the surface of the copper pad, and the nickel film could not be formed.

The obtained nickel film was observed with a metallurgical microscope (magnification of 1000 times), and the number of copper pads was counted on which nickel was normally deposited. Here, "the nickel was normally deposited" means that the whole surface of the copper pad is covered with the nickel film, and the uncovered part is not confirmed with the metallurgical microscope. The results are shown in Table 1. The determination criteria of ○, Δ and X in Table 1 are as follows.

○: Copper pads on which nickel is normally deposited are 30 pads.
Δ: Copper pads on which nickel is normally deposited are 15 to 29 pads.
X: Copper pads on which nickel is not normally deposited at all are 30 pads.

TABLE 1

| Example 1 | Comparative Example 1 | Comparative Example 2 | Reference Example 1 | Reference Example 2 |
|---|---|---|---|---|
| ○ | ○ | Δ | X | X |

As shown in Table 1, when Comparative Example 1 is compared with Reference Example 1 and Comparative Example 2 is also compared with Reference Example 2, it can be understood that the palladium catalyst adsorption treatment (S14) is indispensable before the electroless nickel plating (S15) is performed, in order that the nickel film is formed from the electroless nickel plating solution which is used in the electroless nickel plating (S15) of Comparative Example 1 and Comparative Example 2.

In addition, it can be understood that the electroless nickel plating (S15) of Comparative Example 1 can always normally deposit nickel, but the electroless nickel plating (S15) of Comparative Example 2 sometimes fails to normally deposit nickel, and is inferior in a nickel deposition property. In contrast to this, it can be understood that the electroless nickel strike plating step (S4) of Example 1 can normally deposit nickel and is excellent in the nickel deposition property.

1-2. Surface Morphology

In order to evaluate a surface morphology of the nickel film which was formed on the surface of the copper pad, the surface of the nickel film was photographed with a scanning electron microscope (SEM) at magnifications of 5000 times and 30000 times, and a backscattered electron compositional image (COMPO image) was obtained. The results are shown in FIGS. 2 to 4. FIG. 2 shows a COMPO image of the nickel film which was obtained by the electroless nickel strike plating step (S4) of Example 1; FIG. 3 shows a COMPO image of the nickel film which was obtained by the electroless nickel plating (S15) of Comparative Example 1; and FIG. 4 shows a COMPO image of the nickel film which was obtained by the electroless nickel plating (S15) of Comparative Example 2. Magnifications of FIGS. 2(a), 3(a) and 4(a) are 5000 times, and magnifications of FIG. 2(b), FIG. 3(b) and FIG. 4 (b) are 30000 times.

It can be confirmed from FIG. 2 to FIG. 4 that in the nickel film obtained by the electroless nickel strike plating step (S4) of Example 1, there are few black portions as compared with the nickel films obtained by electroless nickel plating (S15) of Comparative Example 1 and Comparative Example 2. The black portion indicates that elements such as carbon, of which the atomic numbers are small, exist on the nickel film. From this result, it can be understood that the nickel film obtained by the electroless nickel strike plating step (S4) of Example 1 has few defects and is a dense film, as compared with the nickel films obtained by electroless nickel plating (S15) of Comparative Example 1 and Comparative Example 2. In addition, the nickel film obtained by the electroless nickel plating (S15) of Comparative Example 2 shows particularly many black portions, and it can be understood from the result that the nickel film has many defect portions and is not a dense film.

Furthermore, it can be confirmed that in the nickel films obtained by the electroless nickel plating (S15) of Comparative Example 1 and Comparative Example 2, film roughness is large, but on the other hand, in the nickel film obtained by the electroless nickel strike plating step (S4) of Example 1, film roughness is fine. From this result, it can be understood that the nickel film obtained by the electroless nickel strike plating step (S4) of Example 1 is excellent in smoothness, as compared with the nickel film obtained by electroless nickel plating (S15) of Comparative Example 1 and Comparative Example 2. In addition, in the nickel film of Comparative Example 2, film roughness is large, and it can be understood from the result that the nickel film is inferior in the smoothness.

It can be understood from the above description that the nickel film can be obtained which is dense and is excellent in the smoothness, according to the electroless nickel strike plating step (S4) of the electroless plating process of Example 1, as compared to the electroless nickel plating (S15) of the electroless plating process of Comparative Example 1 and Comparative Example 2.

1-3. Surface Elemental Analysis

The nickel film which was formed on the surface of the copper pad was subjected to a surface elemental analysis by an Auger Electron Spectroscopy Analyzer. As described above, the nickel film of Comparative Example 2 is inferior in the performance, and accordingly only the nickel film of Example 1 and Comparative Example 1 were targeted.

The nickel film was subjected to reflow treatment three times. The reflow treatment was performed by preliminarily heating the nickel film at 230° C., and then heating the resultant film at 250° C. The surface elemental analysis was performed before the nickel film was subjected to the reflow treatment and after the nickel film was subjected to the reflow treatment and then was naturally cooled to normal temperature. As for measurement conditions of the surface elemental analysis, an acceleration voltage was set at 10 kV, a probe current value was set at 10 nA, a measuring diameter was set at 50 μm, and a scanning range was set at 30 to 2400 eV. The results are shown in Table 2. The numerical values in Table 2 are values which have been obtained by quantifying the elements from the peak intensity ratio of the obtained spectrum (unit:atomic %). The mark—in Table 2 means that the corresponding element has not been detected at all.

TABLE 2

|  | Number of reflows | Ni | P | Cu | C | N | O | S | Cl |
|---|---|---|---|---|---|---|---|---|---|
| Example 1 | 0 Time | 44.6 | — | — | 26.2 | — | 27.3 | — | 1.9 |
|  | 1 Time | 21.9 | — | — | 52.9 | — | 25.2 | — | — |
|  | 2 Times | 15.1 | — | — | 63.4 | — | 21.5 | — | — |
|  | 3 Times | 15.1 | — | 1.7 | 62.6 | — | 20.6 | — | — |
| Comparative Example 1 | 0 Time | 38.6 | 3.4 | — | 37.1 | — | 19 | — | 1.9 |
|  | 1 Time | 21.6 | 1.7 | — | 58.2 | — | 17.3 | — | 1.2 |
|  | 2 Times | 17.8 | 2.1 | 1.1 | 60.6 | — | 17.1 | — | 1.3 |
|  | 3 Times | 15.6 | 2 | 1.2 | 63.5 | — | 17.7 | — | — |

It was thought that the nickel film obtained by the electroless nickel strike plating step (S4) of Example 1 contained boron which originated in dimethylamine borane, but in fact, boron was not detected, and it was found that the nickel film was formed from substantially pure nickel. On the other hand, as shown in Table 2, the nickel film obtained by the electroless nickel plating (S15) of Comparative Example 1 was formed from a nickel-phosphorus alloy containing phosphorus which originated in sodium hypophosphite.

It can be understood from Table 2 that in the nickel film obtained by the electroless nickel strike plating step (S4) of Example 1, copper did not diffuse to the surface thereof even after the second reflow treatment, and that a barrier performance was excellent. On the other hand, it can be understood that in the nickel film obtained by electroless nickel plating (S15) of Comparative Example 1, copper did not diffuse to the surface after the first reflow treatment, but diffused to the surface after the second reflow treatment, and that the barrier performance was inferior.

1-4. Low Potential Electrolysis

Here, a copper plate was used in place of the above described test board, and a nickel film of which the film thickness was 0.01 μm was formed on the surface of the copper plate. Then, the obtained nickel film was subjected to a low potential electrolysis of 50 mV in a 0.5% by volume of a sulfuric acid solution, and barrier properties were evaluated. The results are shown in FIG. 5. In the figure, the horizontal axis is an electrolysis time period, and the vertical axis is a current density. The increase in the current density indicates that copper has dissolved from the copper material which is a lower layer of the nickel film.

As shown in FIG. 5, it can be understood that the nickel film obtained by the electroless nickel strike plating step (S4) of Example 1 shows a small increase in the current density, as compared to the nickel film obtained by the electroless nickel plating (S15) of Comparative Example 1, and accordingly is excellent in the barrier properties.

It can be understood from the results of the above nickel deposition property, surface morphology, surface elemental analysis and low potential electrolysis that the electroless nickel strike plating step (S4) of the electroless plating process of Example 1 can obtain the nickel film which is excellent in the nickel deposition property, is dense and smooth, and is excellent in the barrier performance, as compared to the electroless nickel plating (S15) of the electroless plating processes of Comparative Example 1 and Comparative Example 2. Furthermore, it can be understood that the nickel film obtained by the electroless nickel strike plating step (S4) in the electroless plating process of Example 1 has a superior performance to a nickel film which has the same film thickness as the above film and has been obtained by the electroless nickel plating (S15) of the electroless plating processes of Comparative Example 1 and Comparative Example 2.

2. Evaluation for Ni/Pd/Au Film

Here, a test board was used in which fine wires of copper of which the wiring width/wiring space (L/S) was 30 to 100 μm/30 to 100 μm were arranged on an insulating base material, and also copper pads of which fine wires had a diameter of 0.45 mm were arranged in a lattice form at spaces of 0.45 μm. This test board was subjected to all 6 steps of the electroless plating process of Example 1, or to all seven steps of the electroless plating process of Comparative Example 1, and thereby an Ni/Pd/Au film was formed on the surface of the copper material (fine wires and pads).

In the electroless plating process of Example 1, the Ni/Pd/Au film was obtained that was formed of the nickel film of which the film thickness was 0.01 μm, the palladium film of which the film thickness was 0.1 μm, and the gold film of which the film thickness was 0.1 μm. In the electroless plating process of Comparative Example 1, the Ni/Pd/Au film was obtained that was formed of the nickel film of which the film thickness was 0.5 μm, the palladium film of which the film thickness was 0.1 μm, and the gold film of which the film thickness was 0.1 μm. Then, the obtained Ni/Pd/Au films were subjected to the following evaluation.

2-1. Solder Spreadability

The surface of the Ni/Pd/Au film was soldered, and then the solder spread test was performed. Eco Solder (registered trademark) M770 made by SENJU METAL INDUSTRY CO., LTD. was used as a solder ball, and the diameter D of the solder ball was set at 700 μm. The solder spread test was performed by using a solder reflow furnace (Japan Pulse Laboratories, Inc., RF-330), at a preheating temperature of 230° C. and a reflow temperature of 250° C., with the use of AGF-780DS-AA made by Asahi Chemical Research Laboratory Co., Ltd. as a flux. Then, the height H (μm) of the solder ball was measured after the reflow; and the spreading rate S was calculated according to the following expression, and the maximum value, the minimum value and the average value thereof were determined. Furthermore, the Ni/Pd/Au film which was subjected to heat treatment at 250° C. for 4 hours before soldering was also subjected to the solder spread test similarly. The results are shown in FIG. 6. "Absence of heat treatment" in FIG. 6 shows results of the solder spread test of the Ni/Pd/Au film which was soldered without being subjected to the above described heat treatment after the electroless plating process of Example 1 or Comparative Example 1, and "presence of heat treatment" shows results of the Ni/Pd/Au film which was soldered after having been subjected to the above described electroless plating process and subsequently to the above described heat treatment.

Spreading rate $S=(D-H)/D \times 100(\%)$

It can be understood from FIG. 6 that the Ni/Pd/Au film obtained by the electroless plating process of Example 1 is excellent in solder spreadability, in both of the absence of heat treatment and the presence of heat treatment, as compared with the Ni/Pd/Au film obtained by the electroless plating process of Comparative Example 1. In addition, when the absence of heat treatment is compared with the presence of heat treatment, in the Ni/Pd/Au film obtained by the electroless plating process of Example 1, differences between average values and minimum values are small, but on the other hand, in the Ni/Pd/Au film obtained by the electroless plating process of Comparative Example 1, the average value greatly decreases. From this result, it can be understood that the Ni/Pd/Au film obtained by the electroless plating process of Example 1 shows a high effect of suppressing the diffusion of copper or nickel into the gold film by heat treatment, and can maintain excellent solder spreadability even when the heat treatment has been performed, and has excellent heat resistance.

2-2. Solder Ball Shear Strength

The surface of the Ni/Pd/Au film was soldered, and then a solder ball shear strength was measured. The solder ball shear strength was measured at a shear height of 20 μm and a shear rate of 500 μm/sec with the use of a solder ball shear tester made by Nordson Dage (Series 4000), and the maximum value, the minimum value and the average value thereof were determined. Furthermore, the solder ball shear strength was similarly measured for the Ni/Pd/Au film which was subjected to heat treatment of 250° C. for 4 hours before soldering. The results are shown in FIG. 7. "Absence of heat treatment" in FIG. 7 shows a solder ball shear strength of the Ni/Pd/Au film which has been soldered without being subjected to the above described heat treatment after the electroless plating process of Example 1 or Comparative Example 1, and "presence of heat treatment" shows a result of the Ni/Pd/Au film which has been soldered after having been subjected to the above described heat treatment following the above described electroless plating process.

It can be understood from FIG. 7 that the Ni/Pd/Au film obtained by the electroless plating process of Example 1 has an excellent solder ball shear strength though the numerical value itself is low, in both of the absence of heat treatment and the presence of heat treatment, as compared with the Ni/Pd/Au film obtained by the electroless plating process of Comparative Example 1. In addition, when the absence of heat treatment is compared with the presence of heat treatment, in the Ni/Pd/Au film obtained by the electroless plating process of Example 1, differences between average values and minimum values are small, but on the other hand, in the Ni/Pd/Au film obtained by the electroless plating process of Comparative Example 1, the average value and the minimum value after the heat treatment greatly decrease from those before the heat treatment. From this result, it can be understood that the Ni/Pd/Au film obtained by the electroless plating process of Example 1 shows a high effect of suppressing the diffusion of copper or nickel into the gold film by heat treatment, can maintain an excellent solder ball shear strength even when the heat treatment has been performed, and has excellent heat resistance, as compared to the Ni/Pd/Au film obtained by the electroless plating process of Comparative Example 1.

2-3. Wire Bonding Strength and Fracture Mode

A bonding strength at the time when a gold wire having a wire diameter of 25 μm was bonded to the surface of the Ni/Pd/Au film and then the gold wire was pulled with a pull tester, in other words, a wire bonding strength was measured. Then, the maximum value, the minimum value and the average value thereof were determined. Furthermore, the wire bonding strength was similarly measured also for the Ni/Pd/Au film which was subjected heat treatment at a temperature of 250° C. for 4 hours before soldering. The results are shown in FIG. 8. Furthermore, a fracture mode when the gold wire has been fractured is shown in FIG. 9. "Absence of heat treatment" in FIG. 8 and FIG. 9 shows the wire bonding strength or the fracture mode of the Ni/Pd/Au film which was soldered without performing the above described heat treatment after the electroless plating process of Example 1 or Comparative Example 1, and "presence of heat treatment" shows a result of the Ni/Pd/Au film which was soldered after having been subjected to the above described heat treatment following the above described electroless plating process.

It can be understood from FIG. 8 that the Ni/Pd/Au film obtained by the electroless plating process of Example 1 has the wire bonding strength of the same level as that of the Ni/Pd/Au film which was obtained by the electroless plating process of Comparative Example 1 and was not subjected to heat treatment, in both of the absence of heat treatment and the presence of heat treatment. In addition, when the absence of heat treatment is compared with the presence of heat treatment, in the Ni/Pd/Au film obtained by the electroless plating process of Example 1, differences between average values and minimum values are small, but on the other hand, in the Ni/Pd/Au film obtained by the electroless plating process of Comparative Example 1, the average value and the minimum value greatly decrease.

Furthermore, as shown in FIG. 9, in the Ni/Pd/Au film obtained by the electroless plating process of Example 1, the fracture modes when the gold wire was fractured were all C modes, in both of the absence of heat treatment and the presence of heat treatment. On the other hand, in the Ni/Pd/Au film obtained by the electroless plating process of Comparative Example 1, in the absence of heat treatment, all are the C mode, and in the presence of the heat treatment, 45% were the C mode and 55% were an E mode.

From this result, it can be understood that the Ni/Pd/Au film obtained by the electroless plating process of Example 1 shows a high effect of suppressing the diffusion of copper or nickel into the gold film by heat treatment, can maintain a wire bonding strength and the fracture mode even when the heat treatment has been performed, and has excellent heat resistance, as compared to the Ni/Pd/Au film obtained by the electroless plating process of Comparative Example 1.

It can be understood from the above results of the solder spreadability, the solder ball shear strength, the wire bonding strength and the fracture mode that the Ni/Pd/Au film obtained by the electroless plating process of Example 1 has excellent mounting characteristics which are equal to or better than that of the Ni/Pd/Au film obtained by the electroless plating process of Comparative Example 1, though the film thickness of the nickel film is 1/50. This is considered to be because the nickel film which is formed in the electroless nickel strike plating step (S4) of the electroless plating process of Example 1 is dense and smooth, and is excellent in the barrier performance.

INDUSTRIAL APPLICABILITY

As described above, according to the electroless plating process of the present invention, it is possible to form an Ni/Au film or an Ni/Pd/Au film on a surface of a copper material. The obtained nickel film can surely cover the surface of the copper material even though the film thickness is thin, and accordingly it is possible to achieve the thinning of the nickel film according to the electroless plating process of the present invention. Because the obtained Ni/Au film or the Ni/Pd/Au film can obtain excellent mounting characteristics even though the film thickness of the nickel film is thin, the electroless plating process of the present invention can cope with a complicated wiring pattern and wiring with narrow pitches, and can achieve high density mounting of electronic parts. In addition, the obtained Ni/Au film or Ni/Pd/Au film has a thin overall film thickness and is excellent in flexibility; and accordingly is suitable as a flexible substrate.

Furthermore, the electroless plating process according to the present invention can form the nickel film even without performing the palladium catalyst adsorption treatment (S14) which has been performed in a conventional electroless plating process, and accordingly can improve the productivity.

The invention claimed is:

1. An electroless plating process for sequentially forming a nickel film and a gold film on a surface of a copper material by an electroless plating method, comprising:
    forming the nickel film directly on the surface of the copper material by an electroless strike plating method; and
    forming the gold film by a reduction-type electroless plating method;
    wherein the electroless strike plating method does not include use of a treatment with a palladium catalyst, and is performed by
        immersing the copper material in an electroless nickel strike plating solution that
            contains nickel sulfate hexahydrate in a concentration of 0.002 to 1 g/L in terms of nickel, one or more complexing agents selected from the group consisting of malic acid, glycine, acetic acid, and malonic acid, and one or more reducing agents selected from the group of dimethylamine borane, trimethylamine borane, and hydrazine, but does not contain boric acid, wherein the complexing agent is in a concentration of 0.5 to 5 g/L and the reducing agent is in a concentration of 2 to 10 g/L, and
        has a pH adjusted to 6 to 10 and a bath temperature adjusted to 20 to 55° C.;
    wherein the nickel film has a uniform film thickness of 0.005 to 0.3 μm.

2. The electroless plating process according to claim 1, wherein the electroless plating process is a process for sequentially forming a nickel film, a palladium film and a gold film on a surface of a copper material, and comprises forming a palladium film by a reduction-type electroless plating method between the forming the nickel film and the forming the gold film.

* * * * *